United States Patent
Arts

(10) Patent No.: US 11,114,273 B2
(45) Date of Patent: Sep. 7, 2021

(54) SCREENING METHOD AND APPARATUS FOR DETECTING AN OBJECT OF INTEREST

(71) Applicant: Phenom-World Holding B.V., Eindhoven (NL)

(72) Inventor: Wouter Arts, Eindhoven (NL)

( * ) Notice: Subject to any disclaimer, the term of this patent is extended or adjusted under 35 U.S.C. 154(b) by 0 days.

(21) Appl. No.: 16/674,680

(22) Filed: Nov. 5, 2019

(65) Prior Publication Data
US 2020/0152418 A1    May 14, 2020

(30) Foreign Application Priority Data
Nov. 13, 2018    (EP) .................................... 18205925

(51) Int. Cl.
*H01J 37/24*    (2006.01)
*H01J 37/244*    (2006.01)

(52) U.S. Cl.
CPC ..... *H01J 37/244* (2013.01); *H01J 2237/0492* (2013.01); *H01J 2237/2448* (2013.01); *H01J 2237/2449* (2013.01); *H01J 2237/28* (2013.01)

(58) Field of Classification Search
CPC ............. H01J 37/244; H01J 2237/0492; H01J 2237/2448; H01J 2237/2449; H01J 2237/28
See application file for complete search history.

(56) References Cited

U.S. PATENT DOCUMENTS

| | | | |
|---|---|---|---|
| 2008/0056746 A1* | 3/2008 | Suhara | H01J 37/268 399/56 |
| 2010/0133433 A1* | 6/2010 | Tanimoto | H01J 37/244 250/310 |
| 2013/0167665 A1* | 7/2013 | Niibori | H01L 22/12 73/863.01 |

OTHER PUBLICATIONS

H. Talbot et al., Image analysis of insulation mineral fibres, Journal of Microscopy, vol. 200, Pt. 3, pp. 251-268, Dec. 24, 2001.
H. Talbot and B. Appleton, Efficient complete and incomplete path openings and closings, Image and Vision Computing, Elsevier, vol. 25, No. 4, Feb. 3, 2007, pp. 416-425.
Kenichi Ishizu, et al, Image Processing of Particle Detection for Asbestos Qualitative Analysis Support Method, Particle Counting System Based on Classification of Background Area, Control, 2008 10th International Conference on Automation Robotics and Vision, Dec. 17, 2008, pp. 868-873, Piscataway, NJ.
(Continued)

*Primary Examiner* — Sean M Luck

(57) ABSTRACT

The invention relates to a screening method. The method comprises the step of providing a sample, wherein said sample comprises a sample carrier with a surface structure, as well as an object of interest. The method further comprises the step of acquiring an image of said sample. According to the disclosure, the method comprises the steps of providing information on said surface structure of said sample carrier, which may in particular comprise the step of acquiring an image of said sample carrier. In that case two images are obtained: one more sensitive to the objects of interest, and one more sensitive to the surface structure of the sample carrier. This allows manipulation of the acquired image, using said information on the surface structure of the sample carrier. With this, said manipulated image may be screened for easy and reliable detection of said object of interest.

20 Claims, 8 Drawing Sheets

(56) References Cited

OTHER PUBLICATIONS

Myoung-Ock Cho et al, Automated Counting of Airborne Asbestos Fibers by a High Throughput Miscroscopy (HTM) Method, Sensors, vol. 11, No. 7, pp. 7231-7242, Jul. 18, 2011.
P. Bibiloni, et al., A Survey on Curvilinear Object Segmentation in Multiple Applications, Pattern Recognition, vol. 60, pp. 949-970, Elsevier, Jul. 14, 2016.
Luigi Raspolini, Effective Asbestos Detection with a Scanning Electron Microscope (SEM), ThermoFisher Scientific, Desktop Electron Microscopy Solutions, Aug. 1, 2019.

\* cited by examiner

SCREENING METHOD AND APPARATUS FOR DETECTING AN OBJECT OF INTEREST

BACKGROUND OF THE INVENTION

The present invention relates to a screening method and apparatus for detecting an object of interest. In an embodiment, the present invention is related to the detection of asbestos fibers using a charged particle microscope.

Screening samples for detecting a particular object of interest can be a tedious task. This is in particular the case when a sample is screened for certain objects that are not expected to be there.

For example, in the food and drink industry, samples are gathered from a product, and these products are screened for contaminations, such as, for example, bacteria. In a known prior art method, a sample is obtained from a product, the sample is incubated to allow time for (undesired) bacteria to grow, and then the sample is screened for the presence of these bacteria. When the number of bacteria is below a certain threshold, then this indicates that the product (and the corresponding batch of products) is safe.

In a further example, air samples are gathered from, for example, building locations, and these samples are checked for the presence of asbestos fibers. According to a prior art embodiment, a known volume of air is drawn through gold-coated porous filters. The filters are then placed in an electron microscope. With the microscope some tens to hundreds of images are acquired, from non-overlapping locations, and the images are checked for the presence of fibers. Detection is done based on morphological parameters.

One of the drawbacks in screening is that it is often done by human operators, who need to maintain concentrated attention over prolonged periods of time for detecting an object that may (or may not) occur at an unknown time. These so called vigilant tasks are very hard to perform for an operator, and it is known that these tasks are associated with vigilance decrement: "a deterioration in the ability to remain vigilant for critical signals with time, as indicated by a decline in the rate of the correct detection of signals" (Parasuraman, R. (1986). Vigilance, Monitoring and Search In J. R. Boff, L. Kaufmann & J. P. Thomas (Eds.) Handbook of Human Perception and Performance, Vol. 2, Cognitive Processes and Performance (pp 41-1-41-49). New York, Wiley).

SUMMARY OF THE INVENTION

With the above in mind, it is an object of the present invention to provide an improved screening method.

To this end, a screening method according to claim 1 is provided. The method comprises the step of providing a sample, wherein said sample comprises a sample carrier with a surface structure, as well as an object of interest. In particular, the object of interest can be any desired object, such as a desirable material, or undesired object, such as a bacteria or an asbestos fiber.

According to the method, an image of said sample is acquired. In practice, this means that an image is obtained of at least part(s) of the sample carrier with its surface structure. It is recognized by the inventors that the surface structure of the sample carrier is visible in the acquired image, and that this hinders the detection of the object of interest. For example, the above mentioned asbestos detection method uses gold-coated porous filters. The pores of these filters provide a non-uniform surface structure. The pores are visible in the acquired image, and may obscure parts of the fibers. In addition, the pores provide an image that is relatively complex for quick interpretation, creating a vigilant task for the operator that makes recognition of fibers difficult. To this end, in the method of the disclosure it is proposed to provide information on said surface structure of said sample carrier, and to use this information for manipulating the acquired image. Manipulating means in particular reducing or removing the surface structure of the sample carrier, for creating an image of the sample wherein the surface structure is removed or less pronounced. Then, the manipulated image may screened for detecting said object of interest. Screening the manipulated image is easier and less strenuous, as the complexity of the image is reduced by at least partly removing the surface structure of the sample carrier. With this, the object as defined above is achieved.

Further embodiments will be disclosed below.

The step of providing information on said surface structure may, in an embodiment, comprise the step of acquiring an image of said sample carrier. This may in particular include acquiring an image of the sample carrier alone, i.e. without (or substantially without) the object of interest. For example, it is conceivable that an image of a sample carrier is taken before (potentially) applying the object of interest thereto. Then, an image of the sample (i.e. comprising said same sample carrier but now—potentially—including the object of interest) is acquired as well. As the same carrier is imaged before and after, image manipulation may be used to (partly) remove the surface structure of the carrier from the image of the sample. This way, screening for the object of interest becomes easier.

It is conceivable as well that acquiring an image of the sample carrier comprises the step of acquiring an image of the sample, wherein the imaging technique used is substantially sensitive to said sample carrier, and substantially less sensitive to the object of interest.

In an embodiment, the method comprises the step of using one or more image processing techniques on said acquired image and/or on said manipulated image. The image processing technique may in particular be selected from the group consisting of: a Hough transform, use of a neural network, subtraction of an image of said sample carrier, thresholding, and deconvolution. In particular, a Hough transform is capable of detecting regular geometric shapes, such as lines, squares, circles, etc. The Hough transform may be used to detect the porous structures in one or more of the acquired images, but it may also be used for detecting the object of interest in the manipulated image. The same holds true for the neural network, which in an embodiment is used to detect the object of interest.

In an embodiment, said sample carrier comprises a filter, in particular a gold coated filter. For asbestos detection, the ISO/DIS 14966 norm (*Ambient Air—Determination of numerical concentration of inorganic fibrous particles—Scanning electron microscopy method*) prescribes the use of gold coated capillary-pore track-etched membrane filter with a maximum nominal pore size of 0.8 micrometers. In an embodiment, the sample carrier comprises a filter according to that norm, such that asbestos fibers can be detected under the ISO/DIS 14966 norm. It is noted that any (future) modifications of that norm are expressly intended to be incorporated in the present disclosure.

In an embodiment, a charged particle microscope is used for acquiring said image of said sample. In particular, said charged particle microscope is a scanning electron microscope.

In an embodiment, said charged particle microscope may be used for acquiring an image of the sample, and additionally acquiring an image of the sample carrier for providing information on the surface structure of the sample carrier.

In particular embodiments, using the charged particle microscope, such as the scanning electron microscope, a backscatter electron detector (BSD) is used for acquiring said image of said sample. Additionally, or alternatively, a secondary electron detector (SED) is used for acquiring said second image of said sample carrier. This provides an improved and efficient way of acquiring the relevant data, and screening the sample for the object of interest, such as, for example, asbestos fibers.

The method as disclosed herein may further comprise the step of identifying a characteristic of said object of interest using X-ray dispersion analysis (EDX). This may be done by using the aforementioned charged particle microscope.

As indicated before, the surface structure may comprise a uniform or non-uniform surface structure. When a gold coated filter is used, this filter comprises regular holes that are randomly spread over the surface structure in a non-uniform way. This makes it relatively hard to distinguish objects of interest, such as for example fibrous material. The method as described herein is particularly useful for samples that have a non-uniform surface structure.

The screening method as described herein is also particularly useful for detecting asbestos fibers as an object of interest. The screening method may fit in the aforementioned ISO/DIS 14966 norm, wherein a gold coated capillary-pore track-etched membrane filter is used with a maximum nominal pore size of 0.8 micrometers.

According to an aspect, an apparatus is provided for screening a sample, said sample comprising a sample carrier that has a surface structure, as well as an object of interest, wherein said apparatus comprises:
- a holder for holding said sample;
- an imaging device for acquiring an image of said sample;
- a processing device connected to said imaging device and arranged for providing information on said surface structure of said sample carrier, and for manipulating the acquired image using said information on said surface structure of said sample carrier.

Advantages of such an apparatus have been described above with respect to the method as disclosed herein. In particular, the apparatus allows easier and more efficient detection of objects of interests, by manipulating an acquired image, using information on the surface structure of the sample carrier. Said information on the surface structure may be provided beforehand, for example by providing an image of the surface structure, or by providing a model of the surface structure. Said image may be a pre-recorded image. Said model may contain mathematical and/or statistical information, for example.

It is envisaged that the apparatus as described herein allows human operators to screen the manipulated image more easily and effectively, as the manipulated image is visually less complex and therefore easier to interpret by a human operator. In an embodiment, however, said processing device is arranged for screening said manipulated image for said object of interest. This allows the manipulated image to be screened by means of image analysis techniques, such as, for example a neural network.

In an embodiment, the apparatus comprises a further imaging device connected to said processing device and arranged for acquiring an image of said sample carrier. In particular, said imaging device is arranged to be substantially sensitive to said sample carrier alone, and substantially less sensitive to the object of interest.

In a special embodiment, the apparatus is, or at least comprises, a charged particle microscope. In particular, the charged particle microscope may be a scanning electron microscope (SEM). The charged particle microscope may comprise a backscatter electron detector (BSD) that is arranged for acquiring said image of said sample, and may comprise a secondary electron detector (SED) that is arranged for acquiring said second image of said sample carrier. The BSD is in particular sensitive to the sample carrier including the object of interest, and the SED is in particular sensitive to the sample carrier and insensitive to the object of interest. Therefore, the image obtained with the SED can be used as information regarding the surface structure of the sample carrier for manipulating the image obtained with the BSD. One further advantage is that the image obtained with the SED and the image obtained with the BSD can be obtained substantially simultaneously, using a single scan—giving a high correlation between the two acquired images.

In a further embodiment, the apparatus comprises an X-ray dispersion analysis (EDX) device. With this, it is possible to revisit locations that are identified as being an object of interest (such as, for example, an asbestos fiber) and analyzing the material properties of that object of interest. This way, a characteristic of said object of interest may be identified using X-ray dispersion analysis (EDX). It is possible, for example, that the presence of an asbestos fiber at an identified location is confirmed or rejected.

BRIEF DESCRIPTION OF THE DRAWINGS

The invention will next be explained by reference to several embodiments that are shown in the accompanying drawings, in which.

DETAILED DESCRIPTION OF EMBODIMENTS

Figure 1:
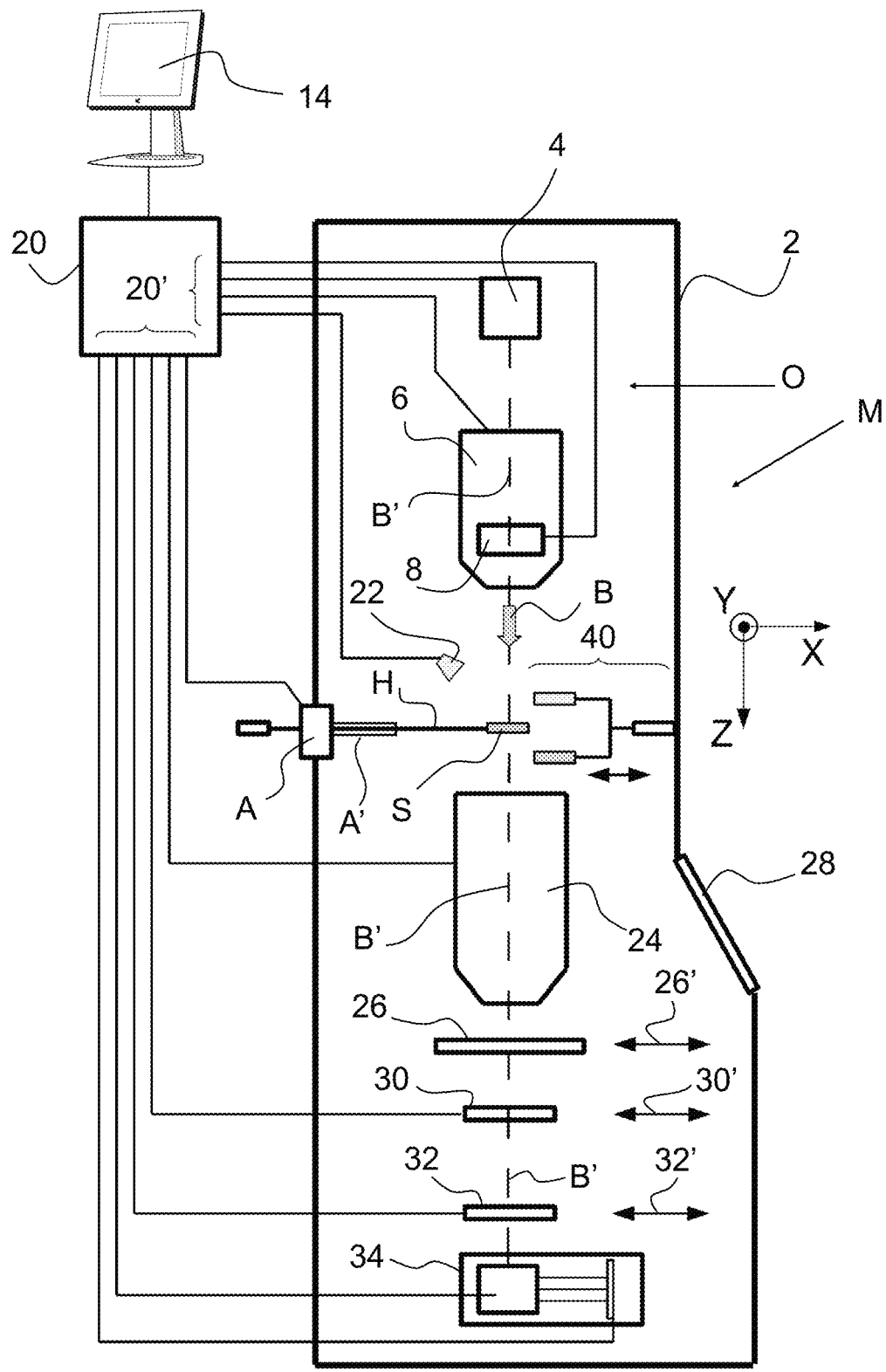
FIG. 1—shows a longitudinal cross-sectional view of a charged particle microscope according to a first embodiment of the invention.

FIG. 1 (not to scale) is a highly schematic depiction of a charged-particle microscope M, as an example of a possible embodiment of the apparatus that may be used to perform the method as disclosed herein. More specifically, it shows an embodiment of a transmission-type microscope M, which, in this case, is a TEM/STEM (though, in the context of the current invention, it could just as validly be a SEM—see FIG. 2—, or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be—locally—thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (14). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

The charged particle microscope M as shown in FIG. 1, thus comprises an optics column O, including a charged particle source 4, a final probe forming lens 6 and a scanner 8, for focusing a beam B of charged particles emitted from said charged particle source 4 onto a specimen. The apparatus further comprises a specimen stage A,H positioned downstream of said final probe forming lens 6 and arranged for holding said specimen S. The charged particle microscope comprises a plurality of imaging devices 22, 24, 26, 30, 32 for acquiring an image of said sample, which in a specific embodiment is the analysis device 22—and in particular the backscatter electron detector device 22 as described above. Further, a processing device 20 is provided in the form of a controller 20, that is connected to said plurality of imaging devices 22, 24, 26, 30, 32 and arranged for providing information on said surface structure of said sample carrier, and for manipulating the acquired image using said information on said surface structure of said sample carrier. Said charged particle microscope M is arranged for executing the method as disclosed herein, which will later be explained by means of FIG. 4 to FIG. 7.

Figure 2:
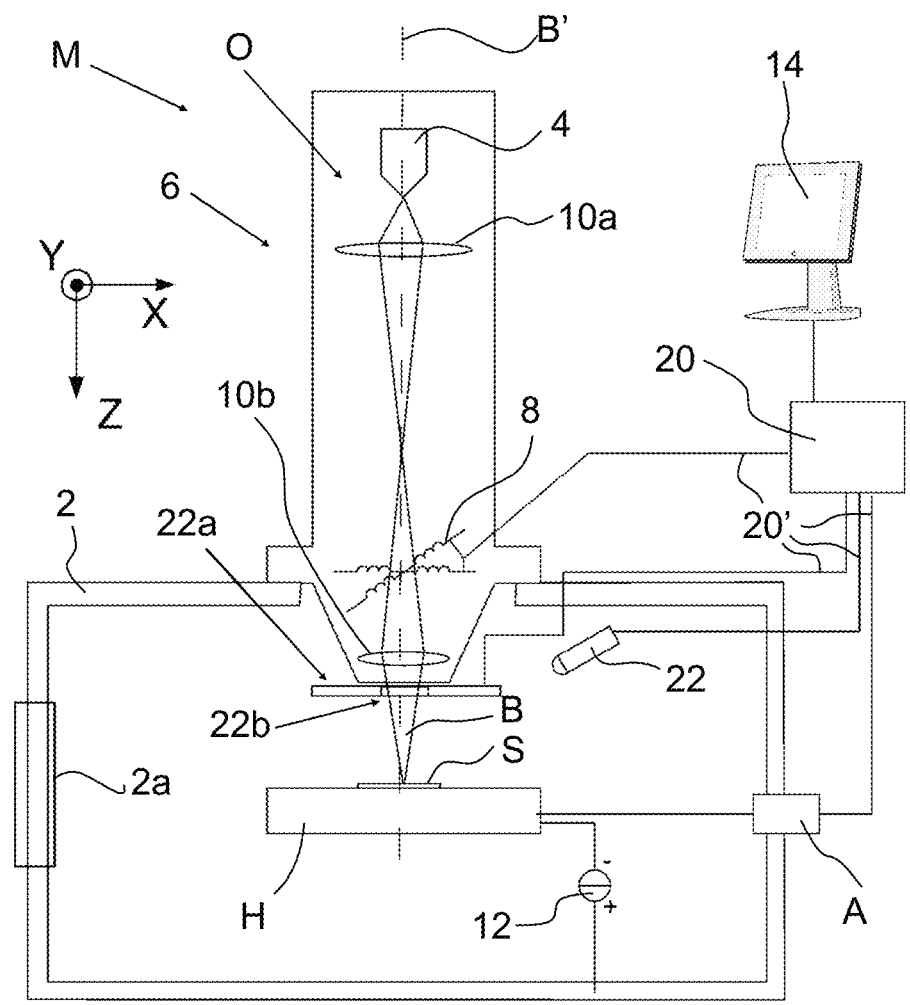
FIG. 2—shows a longitudinal cross-sectional view of a charged particle microscope according to a second embodiment of the invention.

Now first referring to FIG. 2, another embodiment of an apparatus according to the invention is shown. FIG. 2 (not to scale) is a highly schematic depiction of a charged-particle microscope M, as an example of a possible further embodiment of an apparatus that may be used to perform the method as disclosed herein. More specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts:

2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired;

10a, 10b: Schematically depicted lenses/optical elements in illuminator 6;

12: A voltage source, allowing the specimen holder H, or at least the specimen S, to be biased (floated) to an electrical potential with respect to ground, if desired;

22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Thus the charged particle microscope M as shown in FIG. 2 comprises an optics column O, including a charged particle source 4, a final probe forming lens 6, 10a, 10b and a scanner 8, for focusing a beam B of charged particles emitted from said charged particle source 4 onto a specimen S. The apparatus further comprises a specimen stage A,H positioned downstream of said final probe forming lens 6 and arranged for holding said specimen S. The charged particle microscope M comprises an imaging devices 22 for acquiring an image of said sample S, in particular using the backscatter electron detector device 22. Further, a processing device 20 is provided in the form of a controller 20, that is connected to said imaging device 22 and arranged for providing information on said surface structure of said sample carrier, and for manipulating the acquired image using said information on said surface structure of said sample carrier. Like the microscope M as shown in FIG. 1, said charged particle microscope M of FIG. 2 is arranged for executing the method as disclosed herein, which will later be explained by means of FIG. 4 to FIG. 7.

Figure 3:
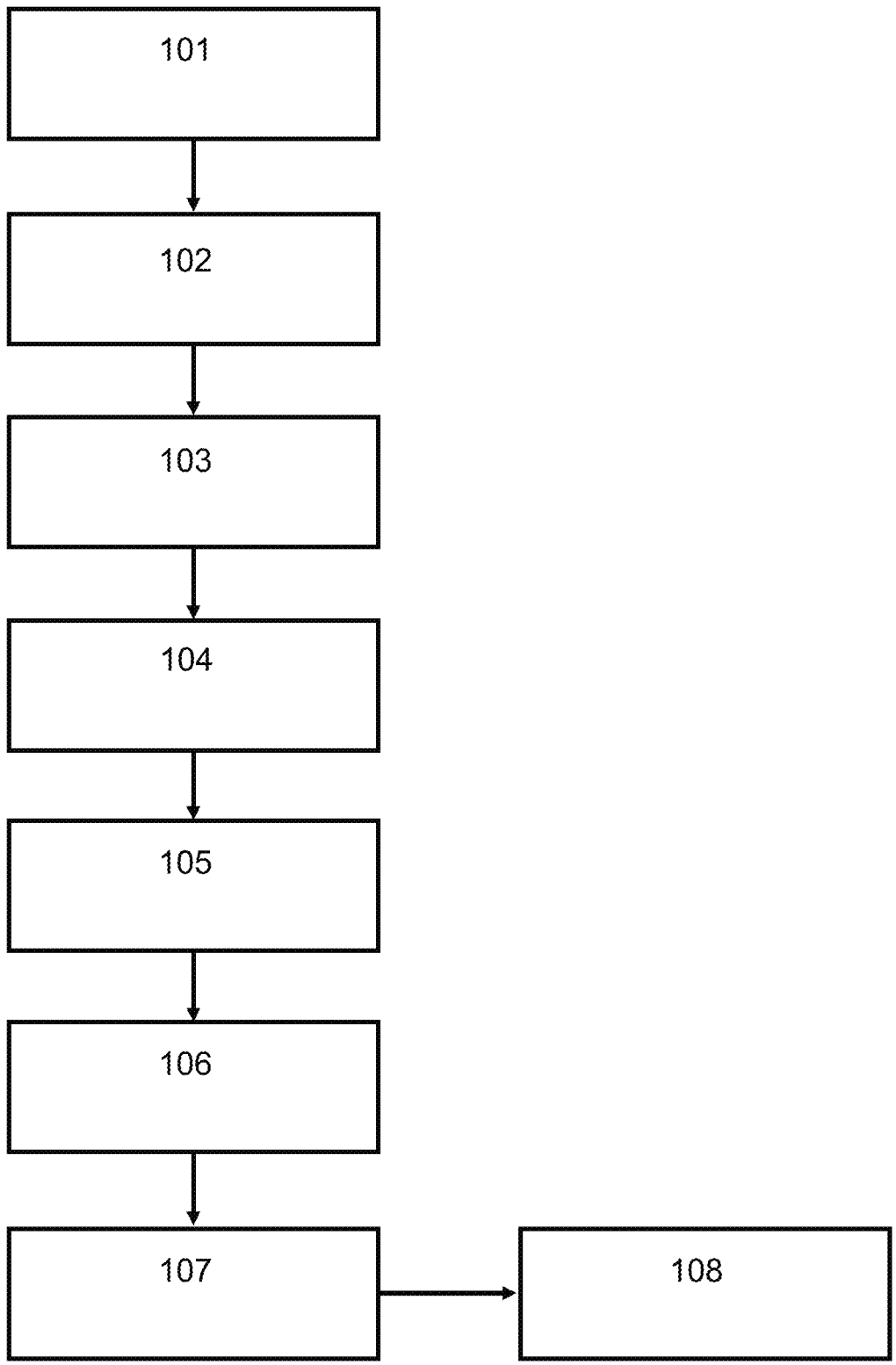
FIG. 3—show a schematic overview of a method for detecting asbestos fibers according to the prior art.

Now referring to FIG. 3, a method for detecting asbestos fibers using a Scanning Electron Microscope (SEM) in line with ISO 14966 norm for inorganic fibrous particles in ambient air using SEM is shown. The international standard ISO 14966:2002 (currently under review, to be replaced by ISO/DIS 14966) specifies a method using scanning electron microscopy for determination of the concentration of inorganic fibrous particles in the air. The method specifies the use of gold-coated, capillary-pore, track-etched membrane filters, through which a known volume of air has been drawn. Using energy-dispersive X-ray analysis, the method can discriminate between fibers with compositions consistent with those of the asbestos varieties (e.g. serpentine and amphibole), gypsum and other inorganic fibers.

ISO 14966:2002 (which document is hereby incorporated by reference) is applicable to the measurement of the concentrations of inorganic fibrous particles in ambient air. The method is also applicable for determining the numerical concentrations of inorganic fibrous particles in the interior atmospheres of buildings, for example, to determine the concentration of airborne inorganic fibrous particles remaining after the removal of asbestos-containing products.

The range of concentrations for fibers with lengths greater than 5 micrometers, in the range of widths which can be detected under standard measurement conditions, is approximately 3 fibers to 200 fibers per square millimeter of filter area. The air concentrations, in fibers per cubic meter, represented by these values are a function of the volume of air sampled.

An embodiment of the method according to ISO 14966:2002, which is known per se to those skilled in the art, generally comprises the steps of (see FIG. 3):

Sampling (101), which includes drawing of a known volume of air through a gold-coated, porous filter;

Checking (102) of the sample by an analyst, to see if the sample is damaged, for example;

Loading (103) the sample into a SEM equipped with an EDS detector;

Acquiring (104) a plurality of images, in particular about hundreds of images are acquired at random, non-overlapping positions on the filter, using the SEM;

Detecting (105) the fibers based on morphological parameters, such as length, width and aspect ratio;

Screening (106), by an analyst, of the detected fibers. The analyst clicks through the images that are labelled in step 105 as fibers, and the analyst verifies whether these fibers should be counted as asbestos;

Acquiring (107) an EDS spectrum of the confirmed fibers, to check whether these fibers are asbestos or not, since energy-dispersive X-ray analysis enables discrimination between fibers with compositions consistent with those of the asbestos varieties (e.g. serpentine and amphibole), gypsum, and other inorganic fibers; and Reporting (108) of the results.

Figure 6A:
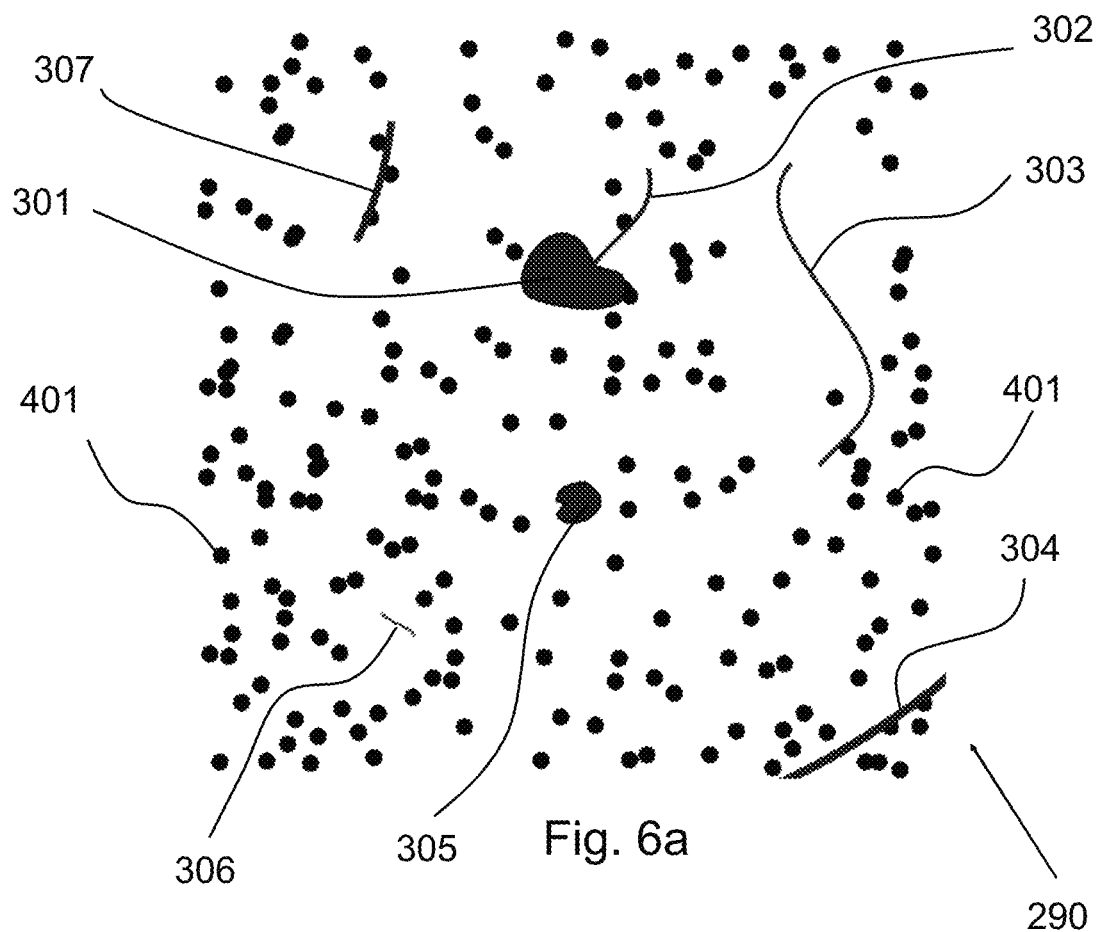
FIG. 6*a*-6*c*—show an embodiment of an acquired image, an image containing information on the surface structure, and a manipulated image of the sample, respectively.

FIG. 6a shows a typical result of an image 290 that is obtained by the SEM in step 104 of FIG. 3. The image 290 contains information of the sample carrier and one or more objects of interest 301-307. It is noted that in the case of asbestos fiber detection, the objects of interest may be true objects of interests (fibers 303, 307, for example), or may be false objects of interest (particles 301 and 305, for example). It should be noted however, that the method as disclosed herein is not limited to the detection of fibers alone, but is applicable to the screening and detection of other objects of interest as well.

It can be seen from FIG. 6a that the background of the image 290 contains a large number of black holes 401 (of which only some are indicated by a reference sign, for sake of clarity). These holes 401 are pores of the gold-coated filter, and are hence related to the surface structure of the sample carrier. It can be seen that some of the holes are (almost) partly overlapping and therefore could have the appearance in the image of being fiber-like. Thus, the presence of these holes makes it difficult for the operator (analyst) to check and confirm the presence of fibers.

Figure 4:
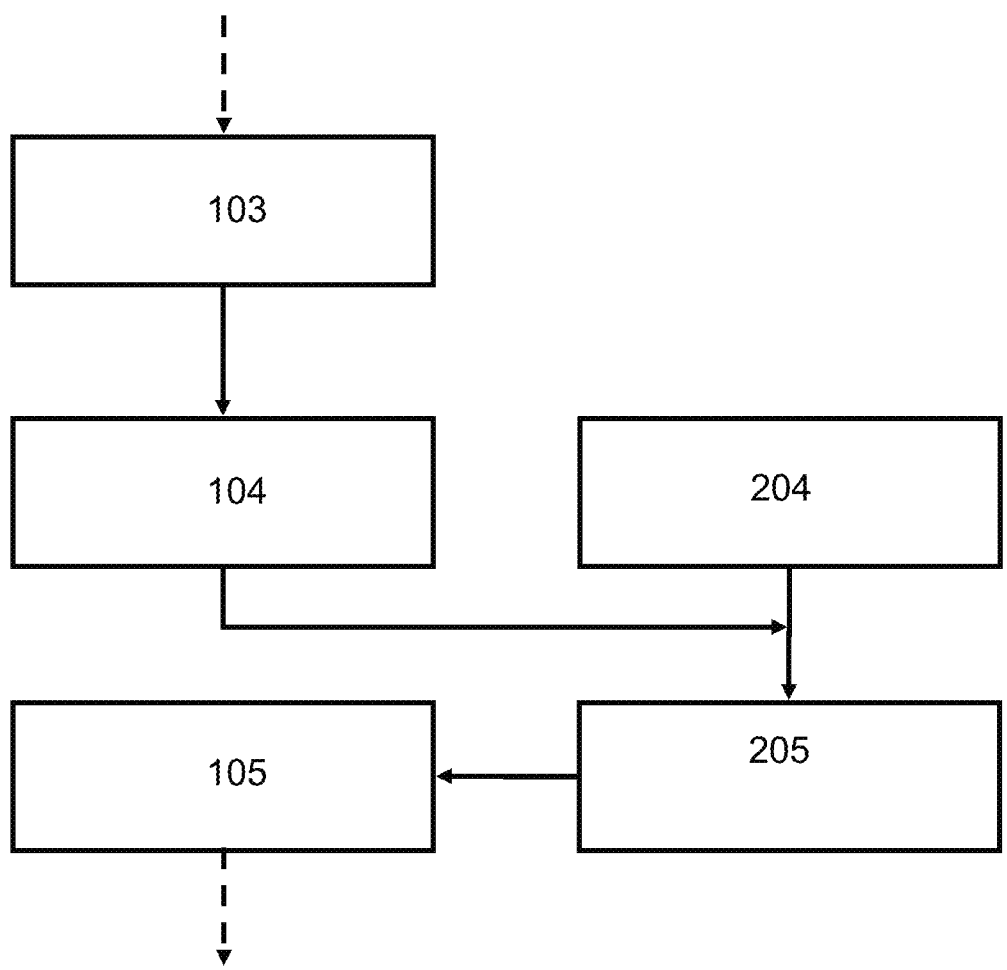
FIG. 4—shows a schematic overview of an embodiment of a screening method in line with the present disclosure.

Now referring to FIG. 4, an improved screening method is discussed, that alleviates the problems associated with the obtained image as shown in FIG. 6a. The method comprises the steps of:
- providing (103) a sample, wherein said sample comprises a sample carrier with a surface structure (401), as well as an object of interest (301-307);
- acquiring an image of said sample (104);
- providing information (204) on said surface structure of said sample carrier, and manipulating (205) the acquired image using said information; and
- screening (105) said manipulated image for said object of interest.

The method as described in FIG. 4 may be used in the method for detecting asbestos fibers as described with respect to FIG. 3, and proposes steps similar to blocks 103-105, with additional (or modified) steps 204 and 205. This means that the method in this embodiment comprises the steps of:
- providing (103) a sample in an electron microscope, wherein said sample comprises a sample carrier with a surface structure (401), as well as an object of interest (301-307), and loading (103) said sample in a SEM equipped with an EDS detector;
- Acquiring (104) a plurality of images, in particular about hundreds of images are acquired at random, non-overlapping positions on the filter, using the SEM;
- providing information (204) on said surface structure of said sample carrier, and manipulating (205) the acquired image using said information; and
- Detecting (105) the fibers, in said manipulated image, based on morphological parameters, such as length, width and aspect ratio;
- Screening (106), by an analyst, of the detected fibers. The analyst clicks through the images that are labelled in step 105 as fibers, and the analyst verifies whether these fibers should be counted as asbestos.

Figure 6B:
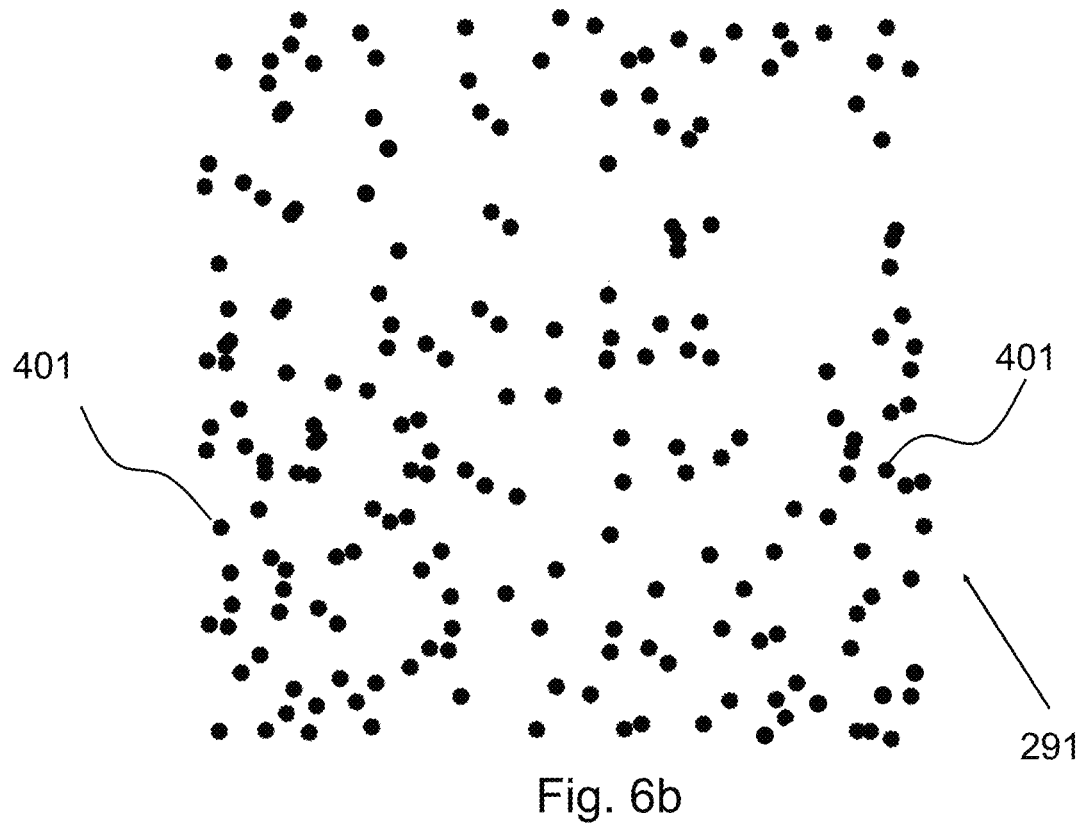
Figure 6C:
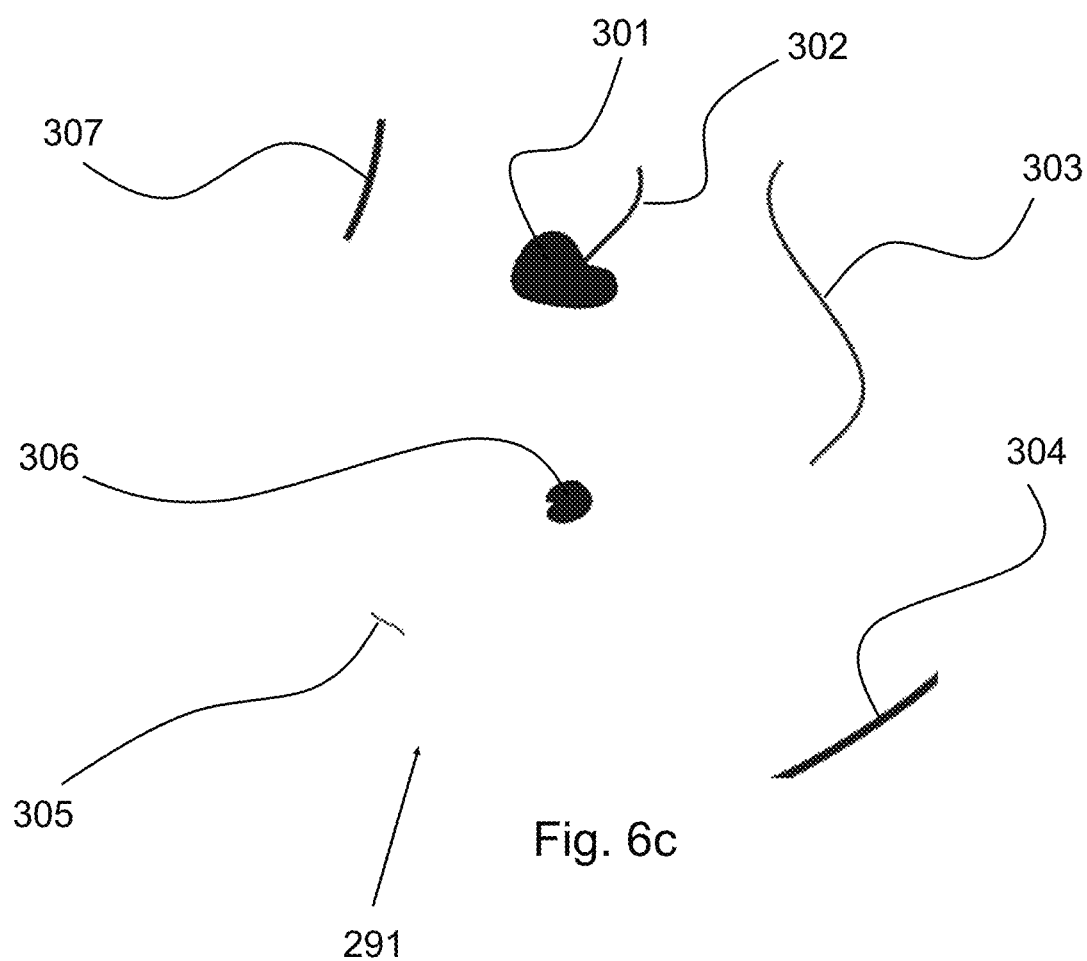

As an example, FIGS. 6a to 6c show how the method described above leads to an improved image for screening objects of interest. As indicated, FIG. 6a shows an acquired image, for example of a gold-coated filter having pores 401, and including several objects of interest 301-307 that are present on the sample, such as particles 301, 305, and fibers 302, 303, 304, 306, 307. This image is one of the images that is acquired in step 104.

In step 204, information is provided on the surface structure of the sample S. This may be done by acquiring an image of the sample carrier, wherein the imaging technique is substantially sensitive to the surface structure of the sample carrier alone. This imaging technique may comprise a manipulation of the image acquired earlier (for example, the image obtained in step 104, see FIG. 6a). This manipulation may comprise a neural network or a Hough transform, for example, for detecting pores 401 and filtering out the objects of interest 301-307. Other imaging techniques are conceivable as well. This leads to an image of the surface structure of the sample carrier, substantially without the objects of interest 301-307—as shown in FIG. 6b. By manipulation of the acquired image 290 (FIG. 6a), using the information of FIG. 6b, for example by subtracting image 291 (FIG. 6b) from image 290 (FIG. 6a), it is possible to obtain an image 292 with only the objects of interest (see FIG. 6c). From FIG. 6c it will be clear that this provides an intelligible image for the analyst, that can be analyzed quickly and accurately by an operator.

Figure 5:
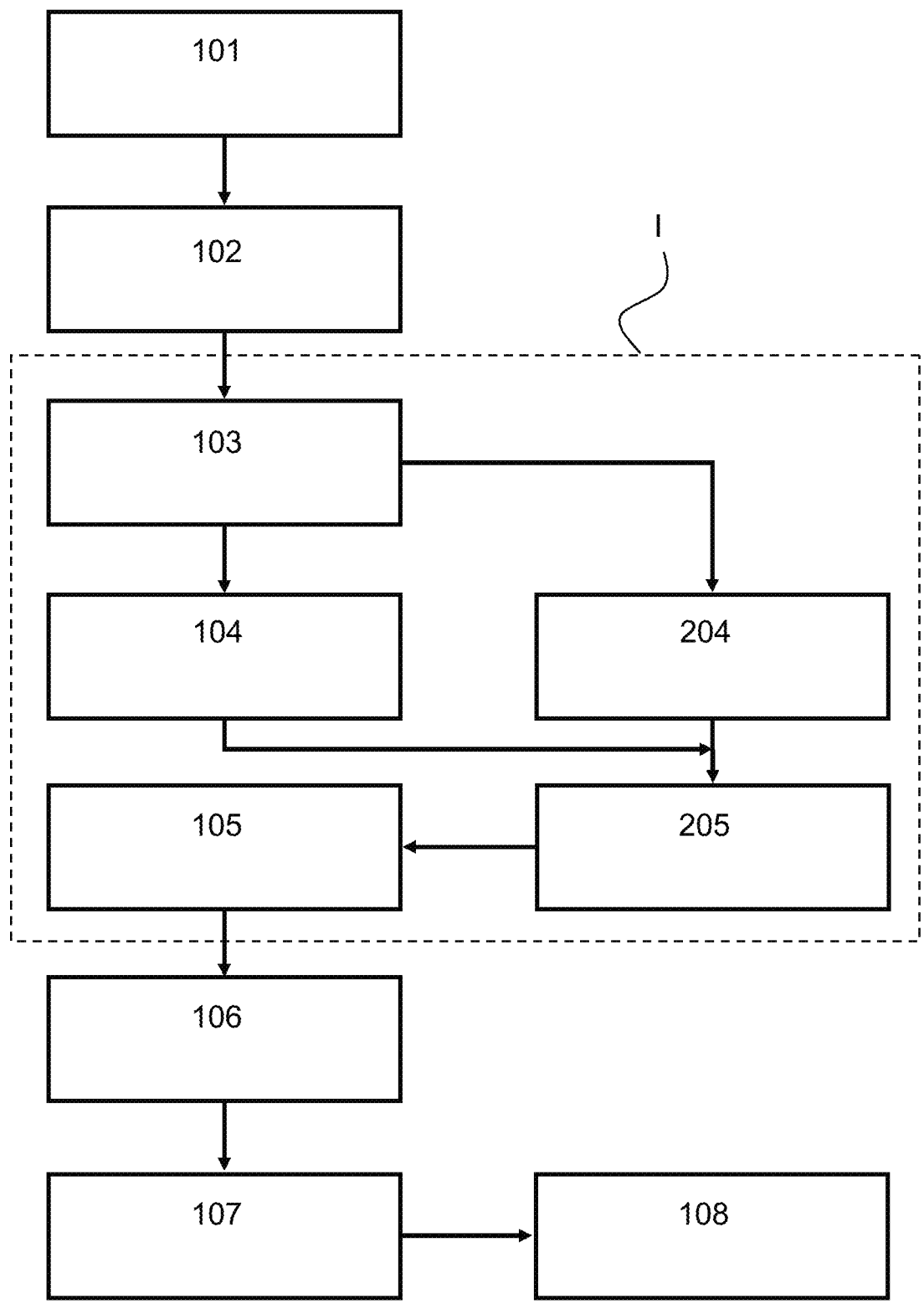
FIG. 5—shows a schematic overview of a further embodiment of a screening method in line with the present disclosure.

FIG. 5 shows a further improvement of the method as disclosed herein (as indicated by rectangle I), and in particular in an embodiment where a SEM is used for detecting asbestos fibers. It should be noted that the method as disclosed herein is also applicable to other screening methods where the acquired image contains sample information and carrier information. It will be understood that the method is not limited to detection of asbestos fibers, and is not limited to the use of an electron microscope.

In the embodiment of FIG. 5, it is indicated that an image of the sample carrier is obtained, wherein said image is substantially sensitive to the surface structure of the sample carrier. This is indicated by block 103 (sample is provided in the electron microscope) leading to block 104 and 204. In this particular example, the scanning electron microscope M is used for:
- acquiring (104) an image of the sample using a backscatter electron detector (BSD); and
- acquiring (204) an image of said sample carrier using a secondary electron detector (SED).

In this case two images are obtained: one more sensitive to the objects of interest, and one more sensitive to the surface structure of the sample carrier. This allows manipulation of the acquired image, using said information on the surface structure of the sample carrier. The image acquired in block 204 is used for manipulation of the image acquired in block 104, and subsequently the manipulated image may be screened 205 for said object of interest. Then, the steps 105-108 may be performed, as explained earlier with respect to FIG. 3.

Figure 7A:
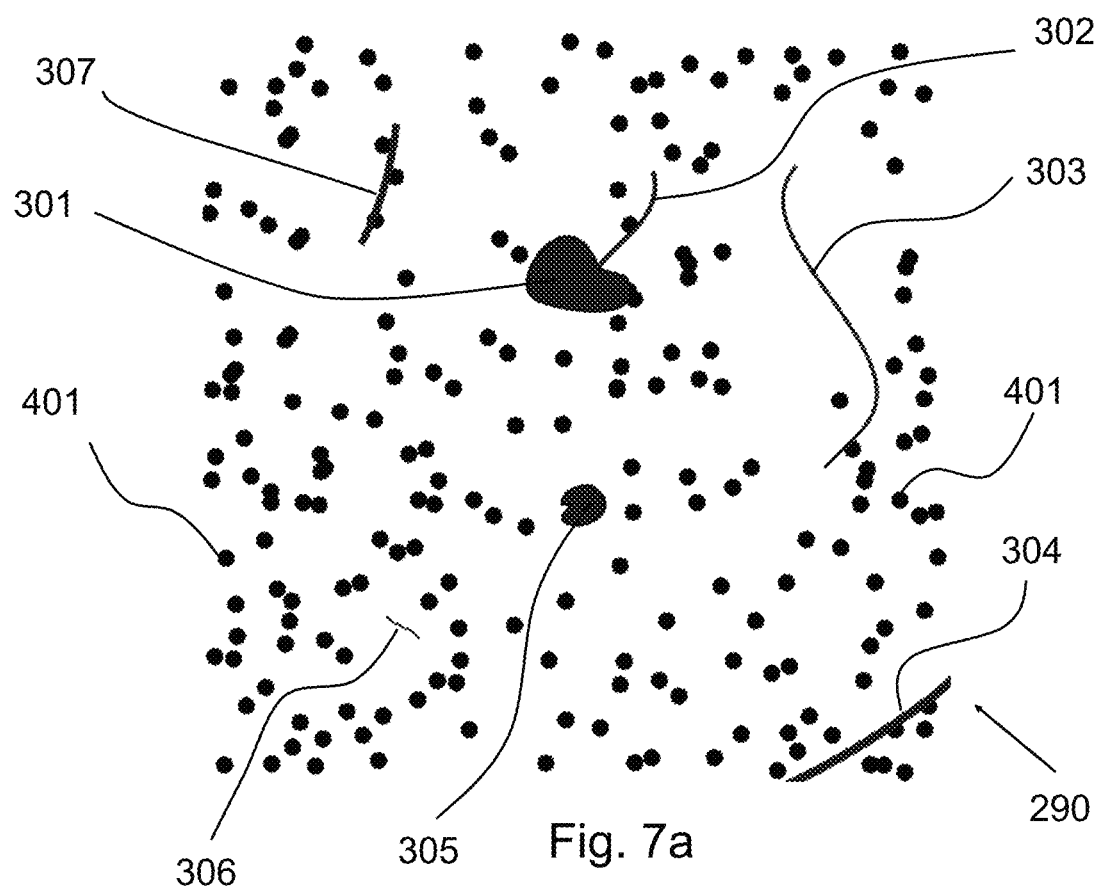
FIG. 7*a*-7*b*—show a further embodiment of an acquired image (similar to FIG. 6*a*), and an image containing information on the surface structure, respectively.
Figure 7B:
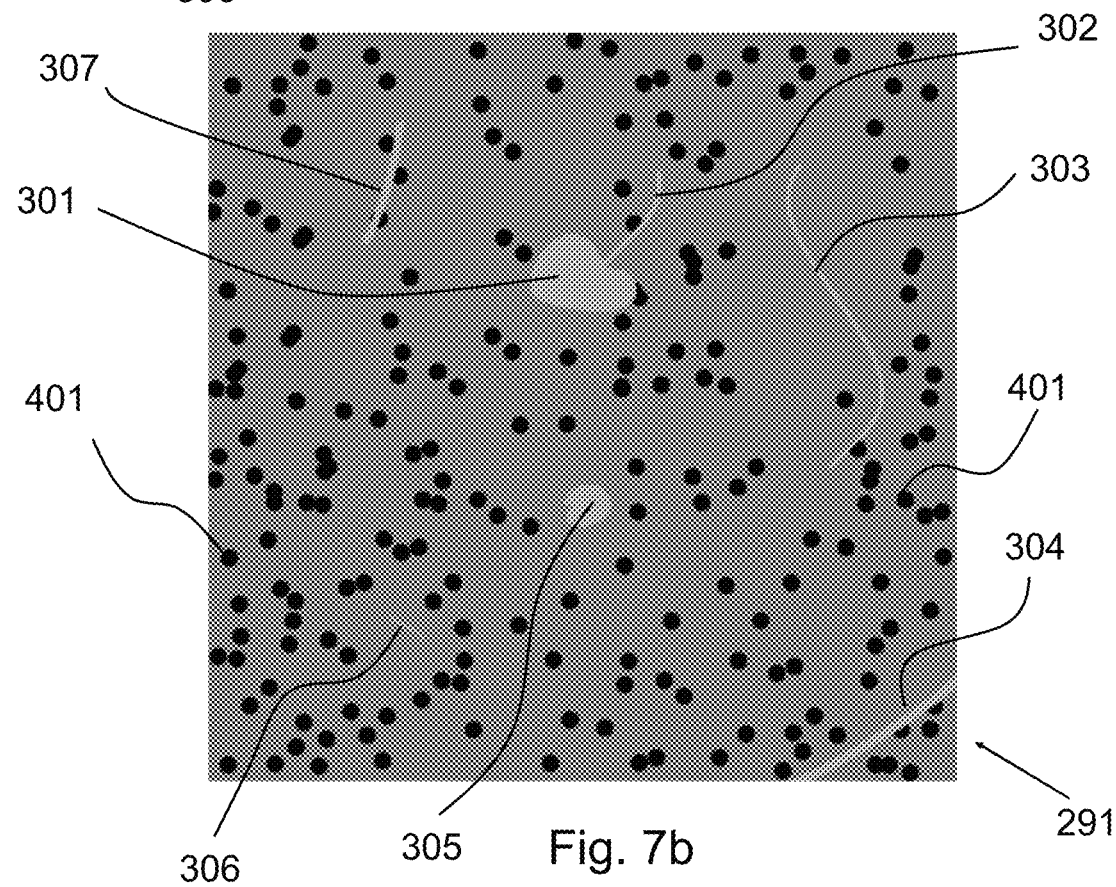

FIGS. 7a and 7b show an example of images obtained with backscatter electron detector (FIG. 7a) and secondary electron detector (FIG. 7b). It can be seen that FIG. 7b is substantially sensitive to the pores 401 of the sample carrier. It should be noted that the objects of interest 301-307 are visible in this image 291 as well. However, the sensitivity of the imaging technique is different for the objects of interest 301-307 (light grey) compared to the sensitivity for the surface structure of the sample carrier 401, and this allows a simple image manipulation technique, such as thresholding, for acquiring an image (see FIG. 6b) containing information on the sample carrier. Thus, manipulation of image 291 in FIG. 7b may be used to manipulate the acquired image 290 (FIG. 7a), for obtaining an image 292 in which the objects of interest are easily recognizable.

It should be noted that the method as described above has mainly been explained by means of reference to a method for detecting asbestos fibers. In principle, however, the method is also applicable for the detection of other objects of interest. For example, it is possible to detect the presence of (metal) particles in cooling liquids and/or lubricants, which may be an indication of machine wear. In another embodiment, it is possible to detect and determine the size of particles, which is in particular of interest in pharmaceutical applications, where solubility is an issue and depends on the particle size. Use of the method is envisaged in the food and drink industry as well, for quality control purposes.

The use of a filter may be part of the method, but the method is not limited to the use of filters. In principle, the method is beneficial for use with any sample carrier that exhibits a surface structure, In particular a non-uniform surface structure, which is the case for filters, but is also applicable to other sample carriers.

Additionally, the method has been explained mainly by means of the use of a charged particle microscope, in particular a SEM. However, any apparatus for screening a sample may be used, and the disclosure is not limited to the use of charged particle microscopy.

In case a SEM is used, in combination with a gold-coated filter and a secondary electron detector for acquiring the image 291 of the sample carrier, then it is in particular useful when the objects of interest have a lower atomic weight compared to gold. This ensures that the contrast between the objects of interest and the holes (see FIG. 7*b*) in the acquired image 291 is sufficient to filter out the undesired objects in image 290 (FIG. 7*a*) and to obtain filtered image 292 (FIG. 6*c*). In principle, other filters and other coatings can be used as well. The filters and coatings may be specifically adapted to comprise a material with an atomic weight that is higher compared to the object of interest. In an example, the method as disclosed herein could for example be used for airborne glass-fiber detection.

In principle, any apparatus comprising an imaging device for acquiring an image of said sample may be used. Said imaging device may, for example, be arranged for detecting electromagnetic radiation in a broad spectrum range, such as x-rays, ultraviolet, visible light, infrared, etc. For example, it is conceivable that the apparatus comprises an optical device, such as an optical microscope. According to the disclosure, the apparatus comprises a processing device connected to said imaging device and arranged for providing information on said surface structure of said sample carrier, and for manipulating the acquired image using said information on said surface structure of said sample carrier. In particular, the apparatus may comprise an additional imaging device for acquiring an image of said surface structure. In another embodiment, the imaging device may be tweaked in such a way that, in a first state, it is more sensitive to the sample, and in a second state is more sensitive to the surface structure of the sample. In that case, an apparatus having a single imaging device may be used.

The desired protection is determined by the appended claims.

The invention claimed is:

1. Screening method, comprising the steps of:
   providing a sample, wherein the sample comprises a sample carrier with a surface structure, as well as an object of interest;
   acquiring an image of the sample;
   providing information on a surface structure of the sample carrier, and manipulating the acquired image using the information; and
   screening the manipulated image for the object of interest.

2. A screening method according to claim 1, wherein the step of providing information on the surface structure comprises the step of acquiring an image of the sample carrier.

3. A screening method according to claim 2, wherein a charged particle microscope is used for acquiring the image of the sample carrier.

4. A screening method according to claim 3, wherein the charged particle microscope is used for acquiring the image of the sample.

5. A screening method according to claim 4, wherein a backscatter electron detector (BSD) is used for acquiring the image of the sample.

6. A screening method according to claim 4, wherein a secondary electron detector (SED) is used for acquiring the image of the sample carrier.

7. A screening method according to claim 4, wherein the image of the sample and the image of the sample carrier are each obtained using a single scan of the charged particle microscope.

8. A screening method according to claim 1, comprising the step of using one or more image processing techniques on the acquired image, in particular selected from the group consisting of:
   a Hough transform;
   use of a neural network;
   subtraction of an image of the sample carrier;
   thresholding; and
   deconvolution.

9. A screening method according to claim 1, wherein the sample carrier comprises a filter, in particular a gold coated filter.

10. A screening method according to claim 1, further comprising the step of identifying a characteristic of the object of interest using X-ray dispersion analysis (EDX).

11. A screening method according to claim 1, wherein the surface structure comprises a non-uniform surface structure, in particular having holes in the carrier.

12. A screening method according to claim 1, wherein the object of interest comprises asbestos fibers.

13. Apparatus for screening a sample, the sample comprising a sample carrier that has a surface structure, as well as an object of interest, wherein the apparatus comprises:
   a holder for holding the sample;
   an imaging device for acquiring an image of the sample;
   a processing device connected to the imaging device and arranged for providing information on a surface structure of the sample carrier, and for manipulating the acquired image using the information on the surface structure of the sample carrier.

14. An apparatus according to claim 13, wherein the processing device is arranged for screening the manipulated image for the object of interest.

15. An apparatus according to claim 13, wherein the apparatus is a charged particle microscope.

16. An apparatus according to claim 13, comprising a further imaging device connected to the processing device and arranged for acquiring an image of the sample carrier.

17. An apparatus according to claim 16, wherein the imaging device is a backscatter electron detector, and the further imaging device is a secondary electron detector.

18. An apparatus according to claim 17, wherein the backscatter electron detector is more sensitive to the sample carrier and the object of interest, and the secondary electron detector is more sensitive to the sample carrier and insensitive to the object of interest.

19. An apparatus according to claim 16, wherein the processing device is further arranged to compare the image of the sample with the image of the sample carrier.

20. An apparatus according to claim 16, wherein the apparatus is a charged particle microscope, and the image of the sample and the image of the sample carrier are each obtained using a single scan of the charged particle microscope.

* * * * *